(12) United States Patent
Huh

(10) Patent No.: US 11,480,474 B2
(45) Date of Patent: Oct. 25, 2022

(54) APPARATUS AND METHOD FOR MEASURING TEMPERATURE OF BATTERY

(71) Applicant: LG Chem, Ltd., Seoul (KR)

(72) Inventor: Geun-Hoe Huh, Daejeon (KR)

(73) Assignee: LG Energy Solution, Ltd.

( * ) Notice: Subject to any disclaimer, the term of this patent is extended or adjusted under 35 U.S.C. 154(b) by 281 days.

(21) Appl. No.: 16/759,403

(22) PCT Filed: Jun. 12, 2019

(86) PCT No.: PCT/KR2019/007095
§ 371 (c)(1),
(2) Date: Apr. 27, 2020

(87) PCT Pub. No.: WO2019/240494
PCT Pub. Date: Dec. 19, 2019

(65) Prior Publication Data
US 2020/0333194 A1  Oct. 22, 2020

(30) Foreign Application Priority Data
Jun. 14, 2018 (KR) .................. 10-2018-0068220

(51) Int. Cl.
*G01R 31/00* (2006.01)
*G01K 7/00* (2006.01)
(Continued)

(52) U.S. Cl.
CPC ............. *G01K 7/00* (2013.01); *G01R 31/374* (2019.01); *G01R 31/396* (2019.01);
(Continued)

(58) Field of Classification Search
USPC .......................... 374/163; 324/426, 431–433
See application file for complete search history.

(56) References Cited

U.S. PATENT DOCUMENTS

2009/0108812 A1  4/2009 Lee
2011/0039134 A1  2/2011 Kim et al.
(Continued)

FOREIGN PATENT DOCUMENTS

EP  2541641 A1  1/2013
EP  2842797 A1  3/2015
(Continued)

OTHER PUBLICATIONS

Extended European Search Report including Written Opinion for Application No. 19819115.7 dated Feb. 5, 2021, 3 pages.
(Continued)

*Primary Examiner* — Vincent Q Nguyen
(74) *Attorney, Agent, or Firm* — Lerner, David, Littenberg, Krumholz & Mentlik, LLP

(57) ABSTRACT

An apparatus and method for measuring temperature of a battery, which may effectively measure a temperature of a secondary battery. The apparatus measures a temperature of a secondary battery at an integrated circuit board configured to contact an electrode lead of the secondary battery, and includes a lead connector mounted on the integrated circuit board and configured such that the electrode lead is connected thereto, a temperature sensor mounted on the integrated circuit board and configured to receive an operation power from the secondary battery as a first terminal provided at one end thereof among a plurality of terminals included therein is in direct contact with the lead connector, and a calculating unit electrically connected to the temperature sensor and configured to measure the temperature of the secondary battery based on an electric signal measured by the temperature sensor.

16 Claims, 10 Drawing Sheets

(51) Int. Cl.
    G01R 31/396    (2019.01)
    G01R 31/374    (2019.01)
    H01M 10/42     (2006.01)
    H01M 10/48     (2006.01)
    H05K 1/18      (2006.01)

(52) U.S. Cl.
    CPC ..... *H01M 10/4257* (2013.01); *H01M 10/486* (2013.01); *H05K 1/181* (2013.01); *H01M 2010/4271* (2013.01); *H05K 2201/10151* (2013.01)

(56) References Cited

U.S. PATENT DOCUMENTS

| | | |
|---|---|---|
| 2011/0123838 A1 | 5/2011 | Lee et al. |
| 2012/0106015 A1 | 5/2012 | Kwak et al. |
| 2013/0302651 A1 | 11/2013 | Kim et al. |
| 2015/0064524 A1 | 3/2015 | Noh et al. |
| 2017/0250552 A1 | 8/2017 | Liu |
| 2017/0343615 A1 | 11/2017 | Lee et al. |
| 2019/0267672 A1 | 8/2019 | Hiasa et al. |
| 2020/0067148 A1* | 2/2020 | Kim .................. H01M 10/425 |

FOREIGN PATENT DOCUMENTS

| | | |
|---|---|---|
| JP | 2002246074 A | 8/2002 |
| JP | 2004228044 A | 8/2004 |
| JP | 2007335352 A | 12/2007 |
| JP | 2011040387 A | 2/2011 |
| JP | 2013246913 A | 12/2013 |
| JP | 2015049935 A | 3/2015 |
| JP | 2018081782 A | 5/2018 |
| KR | 20110056698 A | 5/2011 |
| KR | 101146455 B1 | 5/2012 |
| KR | 20120061004 A | 6/2012 |
| KR | 101249347 B1 | 4/2013 |
| KR | 20130089376 A | 8/2013 |
| KR | 20130125334 A | 11/2013 |
| KR | 20140091123 A | 7/2014 |
| KR | 20150005288 A | 1/2015 |
| KR | 20150026112 A | 3/2015 |
| KR | 101511275 B1 | 4/2015 |
| KR | 20160061638 A | 6/2016 |
| KR | 101717144 B1 | 3/2017 |
| KR | 101817236 B1 | 1/2018 |

OTHER PUBLICATIONS

International Search Report for Application No. PCT/KR2019/007095 dated Sep. 20, 2019, 3 pages.

* cited by examiner

APPARATUS AND METHOD FOR MEASURING TEMPERATURE OF BATTERY

CROSS-REFERENCE TO RELATED APPLICATIONS

The present application is a national phase entry under 35 U.S.C. § 371 of International Application No. PCT/KR2019/007095 filed Jun. 12, 2019, published in Korean, which claims priority from Korean Patent Application 10-2018-0068220 filed Jun. 14, 2018, all of which are incorporated herein by reference.

TECHNICAL FIELD

The present disclosure relates to an apparatus and method for measuring temperature of a battery, and more particularly, to an apparatus and method for measuring temperature of a battery, which may effectively measure a temperature of a secondary battery during the battery temperature measuring process.

BACKGROUND ART

In recent years, the demand for portable electronic products such as notebook computers, video cameras and portable phones has increased sharply, and the electric vehicles, energy storage batteries, robots and satellites has been active developed. Accordingly, high-performance secondary batteries allowing repeated charging and discharging are being actively studied.

Secondary batteries commercially available at present include nickel-cadmium batteries, nickel-hydrogen batteries, nickel-zinc batteries, lithium secondary batteries and the like. Among them, the lithium secondary batteries have almost no memory effect compared to nickel-based secondary batteries and thus are in the limelight due to advantageous of free charging and discharging, low self-discharge rate and high energy density.

Batteries are used in a wide variety of applications, and large capacities are often required for devices such as electric-driven vehicles or smart grid systems to which batteries are frequently utilized. In order to increase the capacity of the battery, the capacity of the secondary battery, namely the capacity of a battery cell itself, may be increased. However, in this case, the capacity increase effect is not large and there is a physical limitation on the size expansion of the secondary battery. Thus, generally, a battery pack in which a plurality of battery modules are connected in series and in parallel is widely used.

The battery pack often includes a battery management system (BMS) that manages battery modules. Further, the BMS monitors the temperature, voltage and current of the battery modules and controls the balancing operation, the cooling operation, the charging operation or the discharging operation of the battery pack based on the monitored state of the battery modules.

The temperature of a battery module, namely the temperature of a secondary battery, is an important factor in the performance of the battery pack. In general, the battery pack may operate efficiently when the temperature of the secondary battery is distributed at an appropriate temperature. For example, if the temperature of the secondary battery is too high, the performance of the battery pack may be deteriorated since the safety of a negative electrode crystal lattice of the secondary battery decreases. Meanwhile, if the temperature of the secondary battery is too low, the performance of the battery pack may be deteriorated due to the decrease in charge/discharge capacity, caused by the increase of internal resistance and polarization voltage of the secondary battery.

Thus, the balancing operation, the cooling operation, the charging operation or the discharge operation of the battery pack needs to be appropriately controlled according to the temperature of the secondary battery. In addition, for this purpose, the temperature of the secondary battery must be accurately measured, and the measured temperature of the secondary battery must be transferred to a microcontroller unit (MCU) of the BMS.

In order to accurately measure the temperature of this secondary battery, it is important that a temperature sensor be disposed as close as possible to the electrode lead of the secondary battery. In the case of using a temperature sensor mounted on a conventional integrated circuit board, the temperature sensor may be configured to be mounted at a position close to the secondary battery in order to obtain an accurate temperature of the secondary battery. However, in this case, since the temperature sensor operates using the operation voltage received from the BMS, the temperature sensor cannot directly contact the electrode lead of the secondary battery.

SUMMARY

Technical Problem

The present disclosure is designed to solve the problems of the related art, and therefore the present disclosure is directed to providing an improved apparatus and method for measuring temperature of a battery, which may effectively measure temperature of a secondary battery during the battery temperature measuring process.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for measuring a temperature of a secondary battery, comprising: a lead connector mounted on an integrated circuit board and configured such that an electrode lead of the secondary battery is connected to the lead connector; a temperature sensor mounted on the integrated circuit board, the temperature sensor including a plurality of terminals, wherein a first terminal of the plurality of terminals is provided at a first end of the temperature sensor and configured to receive an operation power from the secondary battery when in direct contact with the lead connector; and a calculating unit electrically connected to the temperature sensor and configured to measure the temperature of the secondary battery based on an electric signal measured by the temperature sensor.

The apparatus may further comprise a battery management system (BMS) connector mounted on the integrated circuit board and configured to be electrically connected to a BMS provided outside of the integrated circuit board and electrically connected to a second terminal provided at a second end of the temperature sensor.

The integrated circuit board may further include a signal line configured to electrically connect the second terminal and the BMS connector to each other directly.

The apparatus may include a plurality of temperature sensors mounted on the integrated circuit board, and a respective signal line may be provided to the integrated circuit board for each of the plurality of temperature sensors.

The integrated circuit board may include a ground terminal, and the integrated circuit board may further include a ground line configured to electrically connect the second terminal and the ground terminal to each other.

The ground line may be a circuit pattern line branched on the signal line directly connected to the second terminal.

An operation potential of the temperature sensor may indicate a potential applied between the lead connector and the ground terminal.

The apparatus may include a sensing assembly mounted on the integrated circuit board and including a sensing bus bar connected to the electrode lead of the secondary battery to electrically connect the lead connector and the electrode lead of the secondary battery through the sensing bus bar.

The first terminal of the temperature sensor may be configured to receive the operation power from the secondary battery when inserted into the lead connector to directly contact the lead connector.

The first terminal may be configured to protrude out of the lead connector through an inside of the lead connector when in direct contact with the electrode lead.

Both the first terminal of the temperature sensor and the sensing bus bar may be configured to be inserted into the lead connector.

A battery pack according to another aspect of the present disclosure may include the apparatus of any of the embodiments described herein.

An integrated circuit board according to another aspect of the present disclosure may comprise: a lead connector mounted on the integrated circuit board and configured such that an electrode lead of the secondary battery is connected to the lead connector; a temperature sensor mounted on the integrated circuit board, the temperature sensor including a plurality of terminals, wherein a first terminal of the plurality of terminals is provided at a first end of the temperature sensor and configured to use a potential of the secondary battery as an operation potential when a first terminal of the plurality of terminals and provided at a first end of the temperature sensor is in direct contact with the lead connector; and a ground terminal representing a reference potential on the integrated circuit board and configured to be electrically connected to a second end of the temperature sensor.

A method for measuring a temperature of a secondary battery at an integrated circuit board configured to contact an electrode lead of the secondary battery may comprise: supplying a potential of the secondary battery as an operation potential to receive an electric signal from a temperature sensor mounted on the integrated circuit board; and measuring a temperature of the secondary battery based on the electric signal received from the temperature sensor.

Advantageous Effects

According to one aspect of the present disclosure, by using a temperature sensor in direct contact with the lead connector, the temperature of the secondary battery may be accurately measured using the thermal conductivity caused by direct contact of the electrode lead, the lead connector and the temperature sensor of the secondary battery.

In particular, according to according to an embodiment of the present disclosure, by using the potential of the secondary battery as the operation potential of the temperature sensor, it is possible to provide an improved integrated circuit board, which may reduce the size of the connector and the number of lines connecting the temperature sensor and the BMS.

The present disclosure may have various effects other than the above, and other effects of the present disclosure may be understood from the following description and more clearly figured out by the embodiments of the present disclosure.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Figure 1:
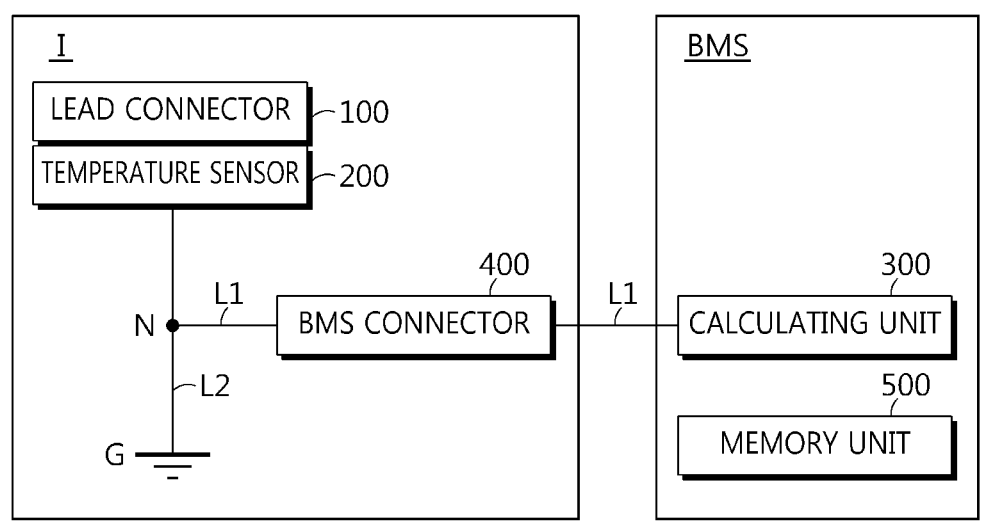
FIG. 1 is a diagram schematically showing a functional configuration of the apparatus for measuring temperature of a battery, according to an embodiment of the present disclosure.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In addition, in the present disclosure, if it is determined that a detailed description of a related known structure or function may obscure the subject matter of the present disclosure, the detailed description will be omitted.

Throughout the specification, when a portion is referred to as "comprising" or "including" any element, it means that the portion may include other elements further, without excluding other elements, unless specifically stated otherwise. Furthermore, the term "calculating unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

In the specification, a secondary battery means one independent cell that has a cathode terminal and an anode terminal and is physically separable. For example, one pouch-type lithium polymer cell may be considered as a secondary battery.

An apparatus for measuring temperature of a battery according to the present disclosure is a device for measuring a temperature of a battery. Here, the battery may include at least one secondary battery. The apparatus for measuring temperature of a battery according to the present disclosure may measure temperature of at least one secondary battery among secondary batteries included in a battery pack. In particular, the apparatus for measuring temperature of a battery according to the present disclosure may be applied to a battery such as at least one lithium secondary battery. Here, the battery may be a concept including a battery module or a battery pack.

The apparatus for measuring temperature of a battery according to an embodiment of the present disclosure may measure the temperature of the secondary battery using a temperature sensor mounted on an integrated circuit board. Here, the integrated circuit board may be configured to contact an electrode lead of the secondary battery. For example, the integrated circuit board may be in direct contact with the electrode lead of the secondary battery. In this case, the integrated circuit board may include a connector configured to directly contact the electrode lead of the secondary battery, and may contact the electrode lead of the secondary battery through the connector.

Alternatively, the integrated circuit board may be in indirect contact with the electrode lead of the secondary battery. In this case, the integrated circuit board may include a connector configured to directly contact a sensing bus bar, which connects the electrode lead of the secondary battery and the integrated circuit board, to contact the electrode lead of the secondary battery through the sensing bus bar.

Figure 2:
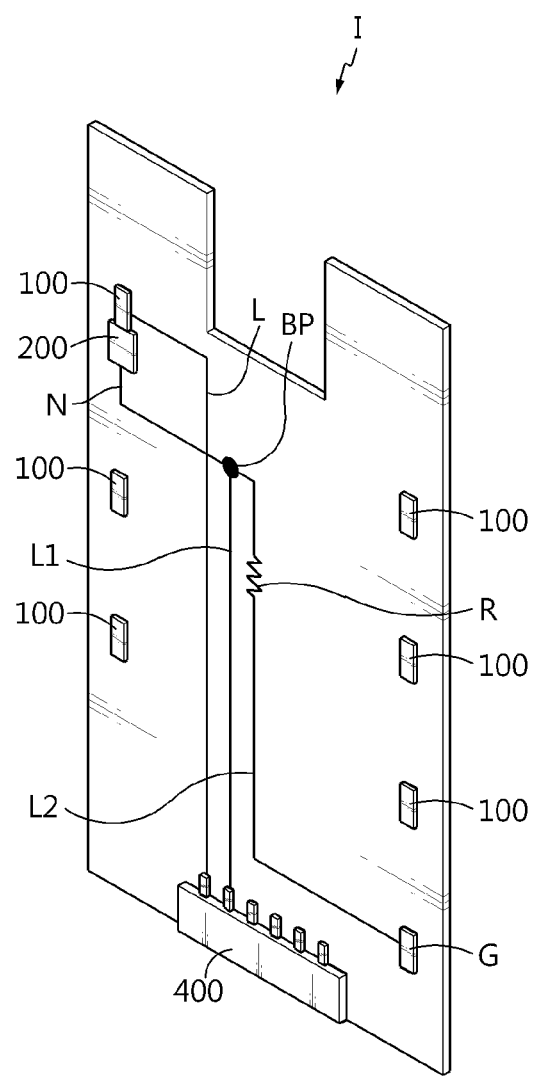
FIG. 2 is a diagram schematically showing that some components of the apparatus for measuring temperature of a battery, according to an embodiment of the present disclosure are mounted on an integrated circuit board.
Figure 3:
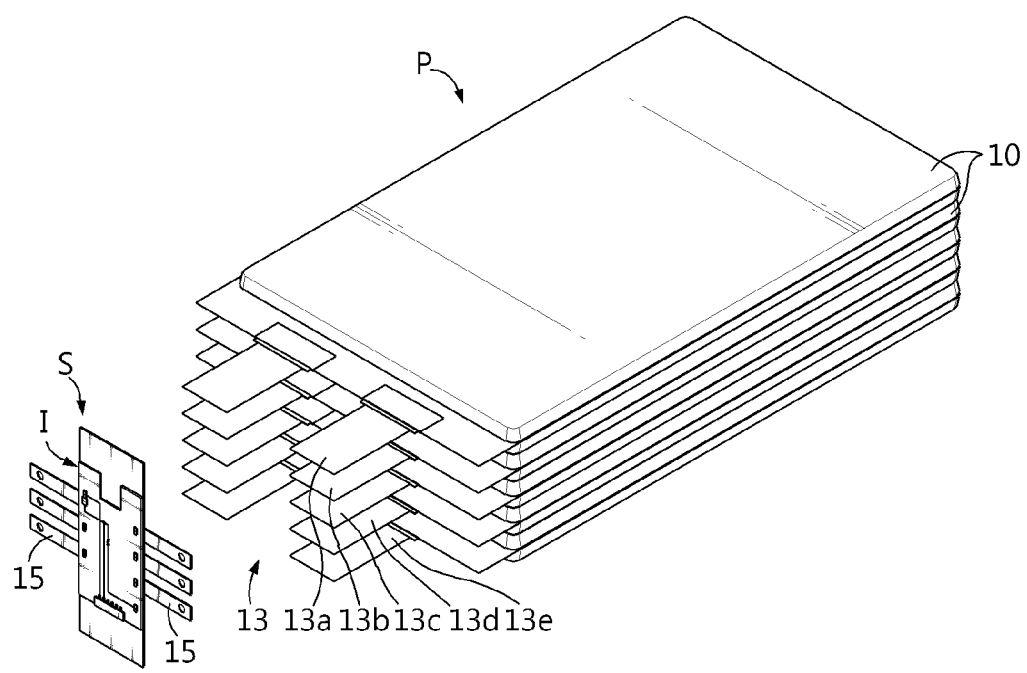
FIG. 3 is a diagram schematically showing that the integrated circuit board according to an embodiment of the present disclosure is connected to an electrode lead of the secondary battery.

FIG. 1 is a diagram schematically showing a functional configuration of an apparatus for measuring temperature of a battery according to an embodiment of the present disclosure. FIG. 2 is a diagram schematically showing that some components of the apparatus for measuring temperature of a battery according to an embodiment of the present disclosure are mounted on an integrated circuit board. FIG. 3 is a diagram schematically showing that the integrated circuit board according to an embodiment of the present disclosure is connected to an electrode lead of the secondary battery.

FIGS. 1 and 2 are diagrams exemplarily showing a schematic configuration of an apparatus for measuring temperature of a battery according to an embodiment of the present disclosure. For example, terminals of a BMS connector 400 may be increased or decreased depending on the number of lead connectors 100 and temperature sensors 200 included in an integrated circuit board I. In addition, the number of sensing lines L, signal lines L1 and/or ground lines L2 may be increased or decreased depending on the number of lead connectors 100 and temperature sensors 200 included in the integrated circuit board I. In FIG. 2, only one sensing line is depicted for convenience of description.

Referring to FIGS. 1 and 2, the apparatus for measuring temperature of a battery according to an embodiment of the present disclosure includes a lead connector 100, a temperature sensor 200, and a calculating unit 300.

The lead connector 100 may be mounted on the integrated circuit board I. Here, the integrated circuit board I means a substrate that is connected to at least one secondary battery 10 included in a battery pack P or a battery module and includes at least one element for transferring information between the secondary battery 10 and the BMS. For example, the integrated circuit board I may be an interconnect circuit board (ICB). Here, the ICB may be mounted to a sensing assembly S provided in the battery pack P. For example, in the embodiment of FIG. 3, the integrated circuit board I may be an integrated circuit board I for transferring information sensed from the electrode lead 13 of the secondary battery 10, for example voltage information, to the BMS. The integrated circuit board I may be formed to have a circuit pattern by applying a thin copper foil on a plate made of an insulating material and removing an unnecessary copper foil according to a circuit diagram.

In addition, the lead connector 100 may be configured to connect the electrode lead 13 of the secondary battery 10. In particular, the lead connector 100 may be mounted on the integrated circuit board I to electrically connect the electrode lead 13 of the secondary battery 10 and the integrated circuit board I to each other. That is, the lead connector 100 may be made of electric conductive and thermally conductive material and attached to the integrated circuit board I. For example, the lead connector 100 may be mounted on the integrated circuit board I by soldering.

Preferably, one end of the lead connector 100 may be coupled in direct contact with the electrode lead 13 of the secondary battery 10, and in this case, the electrode lead 13 of the secondary battery 10 and the lead connector 100 may be coupled and fixed by welding. That is, the lead connector 100 may be directly connected and fixed to a positive electrode lead or a negative electrode lead of the secondary battery 10 by various fastening methods such as welding. However, the electrode lead 13 of the secondary battery 10 and the lead connector 100 may also be connected to each other to include another connection member therebetween. For example, as shown in FIG. 3, a member such as a sensing bus bar 15 may be provided between the electrode lead 13 of the secondary battery 10 and the lead connector 100.

The electrode lead 13 of the secondary battery 10 may be connected to the lead connector in various forms. For example, the electrode lead 13 may be paired with one neighboring lead in a form where an end thereof facing the lead connector 100 is bent. In this case, the ends of two paired leads may be electrically connected to each other. In addition, the ends of the two paired leads may or may not be in direct contact with each other. In the embodiment of FIG. 3, an end 13a of electrode lead 13 is bent toward an end 13b and the end 13b is bent toward the end 13a, so that the ends 13a and 13b may be paired. Similarly, an end of 13c of electrode lead 13 is bent toward an end 13d and the end of 13d is bent toward the end 13c, so that the ends 13c and 13d may be paired. An end 13e may or may not be bent, depending on the shape connected to the integrated circuit board I. For example, the end 13e may not be bent because there is no electrode lead to be paired with the end 13e.

The temperature sensor 200 may be mounted on the integrated circuit board I. In particular, the temperature sensor 200 may be attached onto the integrated circuit board I. For example, the temperature sensor 200 may be mounted on the integrated circuit board I by soldering.

In addition, the temperature sensor 200 may include a plurality of terminals. In addition, a first terminal 210 of the temperature sensor 200 positioned at one end thereof among the plurality of terminals may directly contact the lead connector 100. Here, the first terminal 210 may be a contact terminal that directly contacts the lead connector 100 among the plurality of terminals provided in the temperature sensor 200.

For example, the temperature sensor 200 may include two terminals, one at each end. One terminal located at one end among two terminals provided in the temperature sensor 200 may serve as the first terminal 210 and directly contact the lead connector 100.

The temperature sensor 200 may receive an operation voltage from the electrode lead 13 through the first terminal and the lead connector 100. According to an embodiment, the output voltage of the secondary battery 10 may be 2.5 V to 4.5 V. In this case, even if there is no separate device such as a converter for converting the output voltage of the secondary battery 10 to an operation voltage level of the temperature sensor 200, the temperature sensor 200 may receive the operation voltage from the electrode lead 130 through the lead connector 100.

In particular, the temperature sensor 200 may be coupled and fixed to the lead connector 100 by welding. For example, the first terminal 210 of the temperature sensor 200 may be configured in the form of a metal plate protruding outward from a main body, so that the first terminal 210 may directly contact the lead connector 100 by welding. Through this configuration, the temperature sensor 200 may accurately and easily measure the temperature of the lead connector 100 at a close location. That is, the temperature sensor 200 may measure the temperature of the secondary battery 10 transferred by heat conduction through the lead connector 100.

In addition, the temperature sensor 200 may be configured to use the potential of the secondary battery 10 as an operation potential. More specifically, the temperature sensor 200 may be in direct contact with the lead connector 100 to receive the potential of the secondary battery 10 through the lead connector 100. Preferably, the temperature sensor 200 may be configured to set the voltage applied between the lead connector 100 and a ground terminal G as the operation voltage. Through this configuration, the temperature sensor 200 may be supplied with the operation power from the secondary battery 10.

Through this, the batter temperature measuring apparatus or the integrated circuit board I according to an embodiment of the present disclosure may measure the temperature of the secondary battery 10 through thermal conduction by contact, thereby improving the accuracy of temperature measurement.

The calculating unit 300 may be electrically connected to the temperature sensor 200. More specifically, the calculating unit 300 may be connected to the temperature sensor 200 through an electrical path to exchange an electric signal with the temperature sensor 200. For example, the calculating unit 300 may be connected to the temperature sensor 200 through an electrical path formed in a circuit pattern on the integrated circuit board I. In addition, the calculating unit 300 may be electrically connected to the temperature sensor 200 through a line connecting the integrated circuit board I and the BMS. In this case, another element configured to connect the integrated circuit board I and the BMS may be provided between the calculating unit 300 and the temperature sensor 200. In addition, the calculating unit 300 may be configured to measure the temperature of the secondary battery 10 based on the electric signal measured by the temperature sensor 200.

Preferably, the apparatus for measuring temperature of a battery according to an embodiment of the present disclosure may further include a BMS connector 400 as shown in FIGS. 1 and 2.

The BMS connector 400 may be mounted on the integrated circuit board I. That is, the BMS connector 400 may be attached onto the integrated circuit board I. For example, the BMS connector 400 may be mounted on the integrated circuit board I by soldering. In addition, the BMS connector 400 may be electrically connected to a BMS provided out of the integrated circuit board I. For example, as shown in FIG. 2, the BMS connector 400 may include a plurality of connection pins and connect electrical paths, connected through the respective connection pins, to the BMS, respectively. In addition, the BMS connector 400 may be configured to be electrically connected to the other end of the temperature sensor 200 through a pattern. For example, as shown in FIG. 2, the BMS connector 400 may be electrically connected to the temperature sensor 200 through a circuit pattern formed on the integrated circuit board I. In this case, as shown in FIG. 2, the terminal formed at the other end of the temperature sensor 200 may be electrically connected to the circuit pattern.

Preferably, as shown in FIG. 2, the BMS connector 400 according to an embodiment of the present disclosure may be electrically connected to the lead connector 100 through a sensing path L.

That is, the integrated circuit board I may include the sensing path L that is electrically connected between the lead connector 100 and the BMS connector 400 and through which a sensing signal such as voltage sensing information of a battery flows. The sensing path L is a path connecting the lead connector 100 and the BMS connector 400 and may be provided in the form of a circuit pattern by a copper foil on the integrated circuit board I. In addition, the sensing path L may be formed to be exposed on the integrated circuit board I but may also be formed not to be exposed on the integrated circuit board I. Through the sensing path L and the BMS connector 400, the sensing signal for the secondary battery 10 may be transmitted to the calculating unit 300.

More preferably, the integrated circuit board I according to an embodiment of the present disclosure may further include a signal line L1 as shown in FIGS. 1 and 2.

The signal line L1 is a path for transmitting the sensing information measured by the temperature sensor and may be configured to electrically connect the terminal provided at the other end of the temperature sensor 200 and the BMS connector 400 directly. For example, the signal line L1 may be implemented in the form of a circuit pattern line by a copper foil on the integrated circuit board I. In addition, the signal line L1 may electrically connect the BMS connector 400 and the calculating unit 300. In this case, the signal line L1 may be implemented as a line electrically connecting the integrated circuit board I and the BMS.

More preferably, the integrated circuit board I according to an embodiment of the present disclosure may further include a ground terminal G as shown in FIGS. 1 and 2.

As shown in FIG. 2, the ground terminal G may be mounted on the integrated circuit board I. In addition, the ground terminal G may be connected to the ground to exhibit a reference potential on the integrated circuit board I.

Also, preferably, the integrated circuit board I according to the embodiment of the present disclosure may further include a ground line L2 as shown in FIGS. 1 and 2.

As shown in FIGS. 1 and 2, the ground line L2 may be configured to electrically connect the terminal provided at the other end of the temperature sensor 200 and the ground terminal G. In this case, the ground line L2 may have a resistor R so that a charging/discharging current does not flow to the ground line L2.

In addition, the circuit pattern line connected to one end of the temperature sensor 200 may be branched to the signal line L1 and the ground line L2 based on a branch point BP. In this case, the ground line L2 may be distinguished as a line separate from the signal line L1. That is, the ground line L2 may be formed as a circuit pattern line distinguished from the signal line L1 on the integrated circuit board I.

The signal line L1 and the ground line L2 according to an embodiment of the present disclosure may be circuit pattern lines branched from the circuit pattern lines directly connected to the other end of the temperature sensor 200, respectively. The ground line L2 may branch at the branch point BP provided on the signal line L1. That is, the ground line L2 may be connected to a common node N directly connected to the other end of the temperature sensor 200 so as to be connected to the other end of the temperature sensor 200.

For example, as shown in FIGS. 1 and 2, the ground line L2 may be a line branched at the branch point BP on the signal line L1. Thus, the ground line L2 may be connected to a common node N on the signal line L1 directly connected to the other end of the temperature sensor 200.

Figure 11:
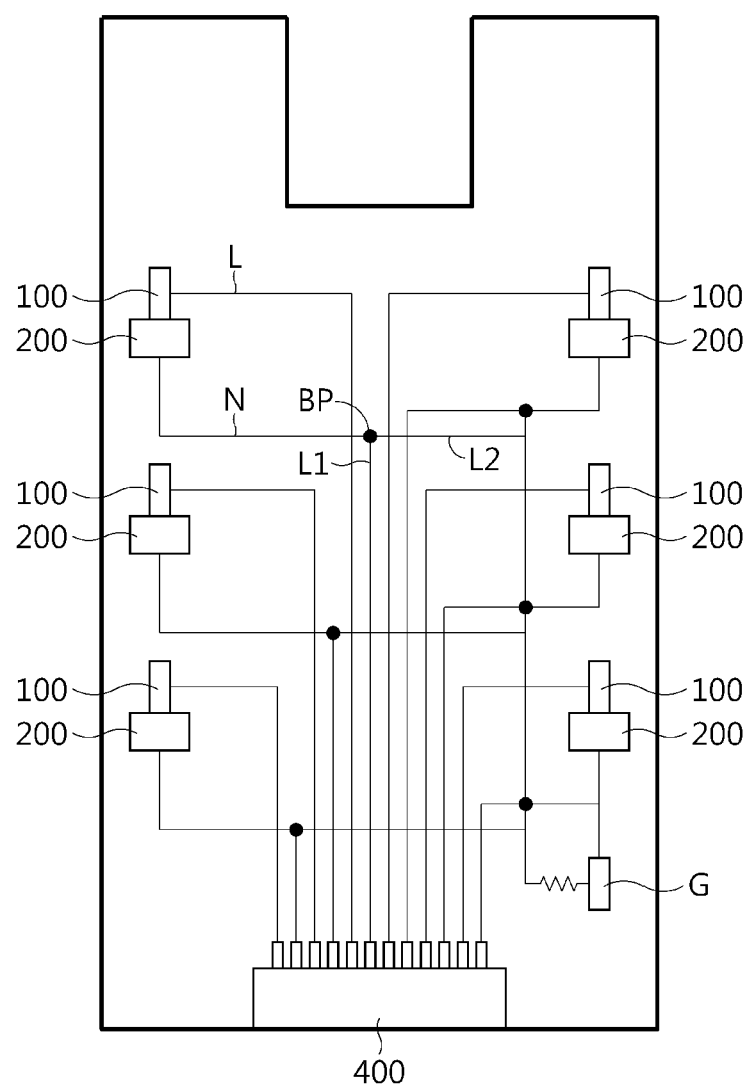
FIG. 11 is another diagram schematically showing some components of the apparatus for measuring temperature of a battery, according to an embodiment of the present disclosure, mounted on an integrated circuit board.

FIG. 11 is a diagram for illustrating an example where a plurality of temperature sensors 200 are provided on the integrated circuit board I. When a plurality of temperature sensors 200 are mounted on the integrated circuit board I, the signal line L1 may be included on the integrated circuit board I as many as the number of temperature sensors 200 mounted on the integrated circuit board I. That is, on the integrated circuit board I, one signal line L1 may be provided for each temperature sensor 200 mounted thereto.

Here, the signal line L1 may electrically connect the temperature sensor 200 and the BMS connector 400 to transfer an electric signal from the temperature sensor 200 to the BMS connector 400. That is, since the first terminal 210 provided at one end of the temperature sensor 200 is in direct contact with the lead connector 100, the temperature sensor 200 may receive the operating power from the secondary battery 10. For this reason, a separate circuit pattern line for supplying the operating power to the temperature sensor 200 may not be formed on the integrated circuit board I.

For example, FIGS. 1 and 2 are diagrams for illustrating an example where one temperature sensor 200 is provided on the integrated circuit board I. As in the embodiment depicted in FIGS. 1 and 2, when only one temperature sensor is provided on the integrated circuit board I, one signal line L1 may be provided between the temperature sensor 200 and the BMS connector 400.

Through this configuration, the apparatus for measuring temperature of a battery or the integrated circuit board I according to an embodiment of the present disclosure may reduce costs by decreasing the number of circuit pattern lines formed on the integrated circuit board I and improves space utilization.

The integrated circuit board I according to an embodiment of the present disclosure includes a lead connector 100, a temperature sensor 200 and a ground terminal G. The lead connector 100, the temperature sensor 200 and the ground terminal G are described above in detail and thus will not be described again.

Meanwhile, the calculating unit 300 may be implemented to include a processor, an application-specific integrated circuit (ASIC), another chipset, a logic circuit, a register, a communication modem, and/or a data processing device, selectively.

Preferably, the apparatus for measuring temperature of a battery according to an embodiment of the present disclosure may further include a memory unit 500.

The memory unit 500 may store a calculation formula for measuring the temperature of the secondary battery 10 based on the electric signal received from the temperature sensor 200. In addition, the memory unit 500 may be electrically connected to the calculating unit 300 to transmit and receive an electric signal.

Meanwhile, the memory unit 500 is not particularly limited as long as it serves as a storage medium capable of recording and erasing data. For example, the memory unit 500 may be a random access memory (RAM), a read only memory (ROM), a register, a hard disk, an optical recording medium, or a magnetic recording medium. The memory unit 500 may also be electrically connected to the calculating unit 300, for example, via a data bus or the like so as to be accessed by the calculating unit 300. The memory unit 500 may also store and/or update and/or erase and/or transmit data generated when a program including various control logics performed in the calculating unit 300 and/or a control logic is executed.

Referring to FIG. 3, the integrated circuit board I according to an embodiment of the present disclosure may be provided to a battery pack P having at least one secondary battery 10.

The apparatus for measuring temperature of a battery according to an embodiment of the present disclosure may further include a sensing assembly S to which the integrated circuit board I is mounted. For example, as shown in FIG. 3, the integrated circuit board I may be mounted to the sensing assembly S.

The sensing assembly S may include a sensing bus bar 15 connected to the electrode lead 13 of the secondary battery 10. Thus, the sensing assembly S may electrically connect the lead connector 100 and the electrode lead 13 of the secondary battery 10 through the sensing bus bar 15. That is, the integrated circuit board I may be connected to the electrode lead 13 of the secondary battery 10 through the sensing bus bar 15 provided to the sensing assembly S. More specifically, the sensing bus bar 15 may electrically connect the lead connector 100 and the electrode lead 13 of the secondary battery 10.

Through this configuration, the apparatus for measuring temperature of a battery according to an embodiment of the present disclosure measures the temperature of the secondary battery 10 by means of thermal conduction caused by the contact of the electrode lead 13 of the secondary battery 10, the sensing bus bar 15, the lead connector 100 and the temperature sensor 200, thereby improving the measurement accuracy for the temperature of the secondary battery 10.

The apparatus for measuring temperature of a battery according to the present disclosure may include a battery management system (BMS). That is, the BMS according to the present disclosure may be included in the apparatus for measuring temperature of a battery of the present disclosure as described above. In this configuration, at least a part of the components of the apparatus for measuring temperature of a battery according to the present disclosure may be implemented by supplementing or adding functionality of components included in the conventional BMS. For example, the calculating unit 300 and the memory unit 500 of the apparatus for measuring temperature of a battery according to the present disclosure may be implemented as components of the BMS.

Hereinafter, various examples of the configuration where the temperature sensor 200 and the lead connector 100 are in contact with each other in the apparatus for measuring temperature of a battery according to an embodiment of the present disclosure will be described with reference to FIGS. 4 to 9. Here, the first terminal 210 is a terminal provided to the temperature sensor 200 and connected to the lead connector 100. As shown in various figures, the first terminal 210 may have a plate shape. In this case, the first terminal and the lead connector may be connected more easily, and the coupling state thereof may be maintained more stably. However, the present disclosure is not necessarily limited to this terminal shape.

Figure 4:
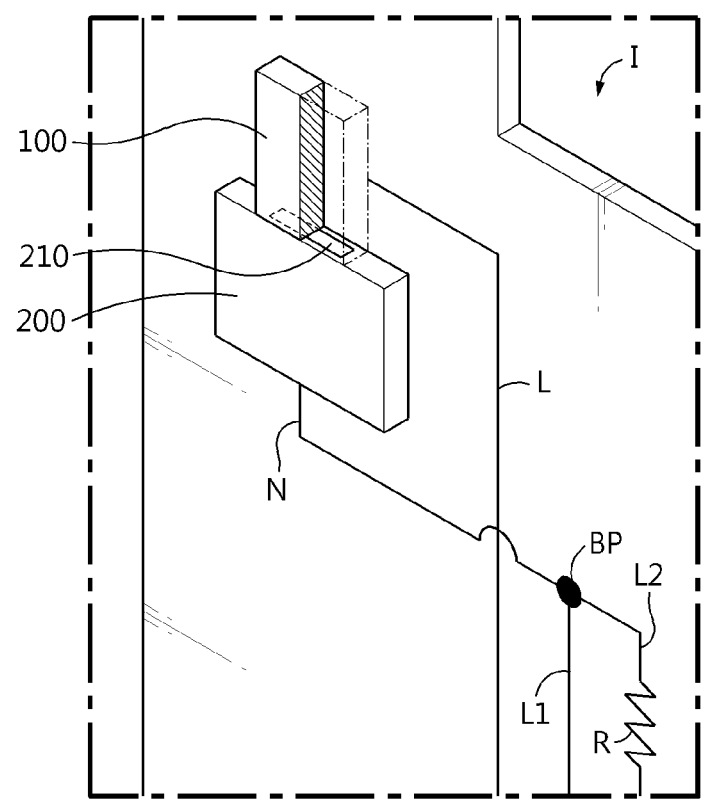
FIG. 4 is a diagram schematically showing a first example of the apparatus for measuring temperature of a battery, according to an embodiment of the present disclosure, where a temperature sensor is in contact with a lead connector.

FIG. 4 is a diagram schematically showing a first example of the apparatus for measuring temperature of a battery according to an embodiment of the present disclosure, where the temperature sensor 200 is in contact with the lead connector 100. Specifically, FIG. 4 is a diagram sectioned to show the contact relationship between the temperature sensor 200 and the lead connector 100 in the first example.

Seeing the first example shown in FIG. 4, the first terminal 210 provided at one end of the temperature sensor 200 may directly contact the lead connector 100. Since the lead connector 100 is made of an electrically conductive and thermally conductive material such as metal, the temperature sensor 200 may be thermally and electrically connected to the electrode lead 13 through the first terminal 210 in contact with one surface of the lead connector 100.

For example, the first terminal 210 of the temperature sensor 200 may be in the shape of a metal plate as shown in FIG. 4. Thus, one surface of the first terminal 210 may be attached to the temperature sensor 200 and the other surface may contact one flat surface of the lead connector 100.

As another example, the first terminal 210 of the temperature sensor 200 may have a shape in which a metal plate protruding outward from the body of the temperature sensor 200 is bent. In this case, the first terminal 210 may be interposed between the temperature sensor 200 and the lead connector 100. That is, one surface of the first terminal 210 may be attached to the temperature sensor 200, and the other surface may contact one flat surface of the lead connector 100.

Thus, the temperature sensor 200 may operate by receiving the potential of the secondary battery as the operation potential through the first terminal 210 contacting one surface of the lead connector 100. In addition, due to the thermal conduction phenomenon, the temperature sensor 200 may sense the temperature of the electrode lead 13.

In the above, an example where one end of the temperature sensor 200 is in direct contact with a portion of the outer surface of the lead connector 100 is described with reference to FIG. 4. However, FIG. 4 shows an example where one end of the temperature sensor 200 is in direct contact with the lead connector 100. Thus, the contact relationship between the temperature sensor 200 and the lead connector 100 is not limited to the example of FIG. 4.

Figure 5:
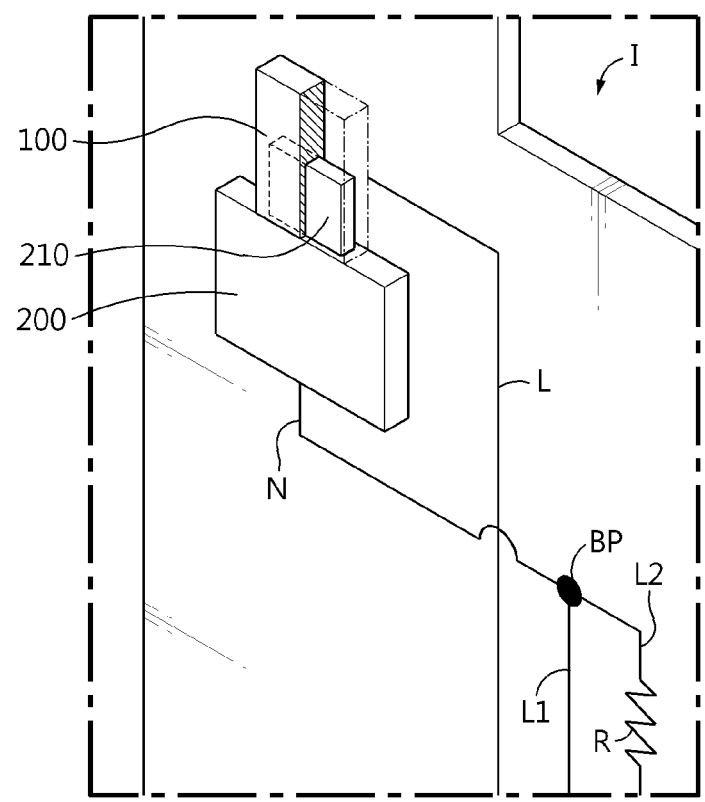
FIG. 5 is a diagram schematically showing a second example of the apparatus for measuring temperature of a battery, according to an embodiment of the present disclosure, where the temperature sensor is in contact with the lead connector.

FIG. 5 is a diagram schematically showing a second example of the apparatus for measuring temperature of a battery according to an embodiment of the present disclosure, where the temperature sensor 200 is in contact with the lead connector 100. Specifically, FIG. 5 is a diagram sectioned to show the contact relationship between the temperature sensor 200 and the lead connector 100 in the second example.

Referring to the second example shown in FIG. 5, the first terminal 210 provided at one end of the temperature sensor 200 may be inserted into the lead connector 100 to be in direct contact with the lead connector 100. For example, as shown in the figure, the first terminal 210 is formed in a plate shape to protrude from the temperature sensor 200 toward the lead connector 100, and an insert groove may be formed at the lead connector 100 in a form corresponding to the first terminal 210. The first terminal 210 may be inserted into the insert groove of the lead connector 100 and contact the lead connector 100.

As described above, since the lead connector 100 is made of a material having both electric conductivity and thermal conductivity, the temperature sensor 200 may be thermally and electrically connected to the electrode lead 13 through the first terminal 210 inserted into the lead connector 100.

The temperature sensor 200 may receive the operation power from the secondary battery through the first terminal 210 inserted into the lead connector 100. In addition, the temperature sensor 200 may sense the temperature of the electrode lead 13. In this case, since the first terminal 210 of the temperature sensor 200 is inserted into the lead connector 100, the temperature sensor 200 according to the embodiment of FIG. 5 may be located closer to the lead connector 100.

In general, as the distance between a temperature measurement target and the temperature sensor 200 increases, the temperature measurement may become inaccurate due to heat loss. Thus, as in the embodiment of FIG. 5, the temperature sensor 200 having the first terminal 210 inserted into the lead connector 100 may more accurately measure the heat conducted from the electrode lead 13 to the lead connector 100.

In addition, since the first terminal 210 of the temperature sensor 200 is inserted into and fixed to the lead connector 100, the contact stability between the temperature sensor 200 and the lead connector 100 may be further improved. That is, if the first terminal 210 is inserted into the lead connector 100, the contact surface between the first terminal 210 and the lead connector 100 increases, thereby improving the contact stability between the first terminal 210 and the lead connector 100. In addition, since the contact area between the first terminal 210 and the lead connector 100 is increased, the heat transfer efficiency between the lead connector 100 and the first terminal 210 may be further improved.

In the above, the example where the first terminal 210 of the temperature sensor 200 is inserted into the lead connector 100 is described with reference to FIG. 5. However, FIG. 5 illustrates an example where the first terminal 210 of the temperature sensor 200 is inserted into the lead connector 100. Thus, the contact relationship between the temperature sensor 200 and the lead connector 100 is not limited to the example of FIG. 5.

Figure 6:
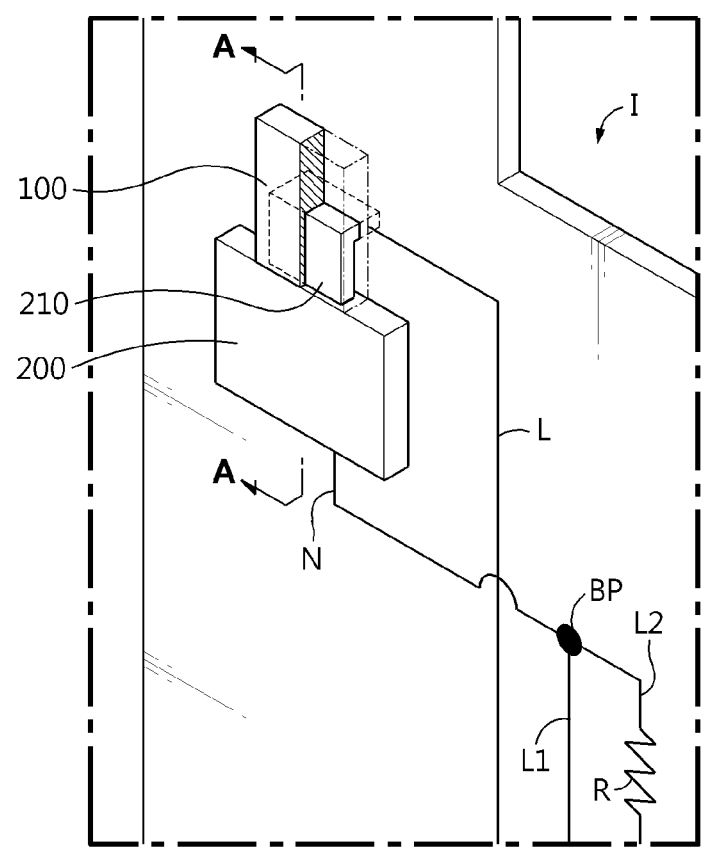
FIG. 6 is a diagram schematically showing a third example of the apparatus for measuring temperature of a battery, according to an embodiment of the present disclosure, where the temperature sensor is in contact with the lead connector.
Figure 7:
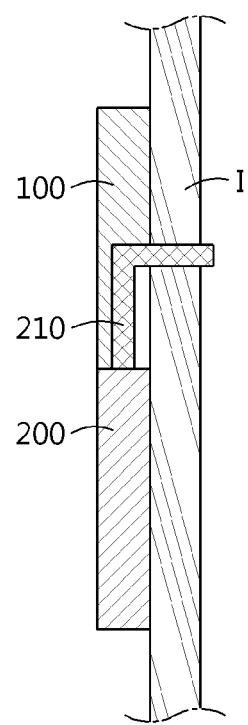
FIG. 7 is a diagram schematically showing the third example of FIG. 6, observed at another side.

FIG. 6 is a diagram schematically showing a third example of the apparatus for measuring temperature of a battery according to an embodiment of the present disclosure, where the temperature sensor 200 is in contact with the lead connector 100. FIG. 7 is a diagram schematically showing the third example of FIG. 6, observed at another side. Specifically, FIG. 6 is a diagram sectioned to show the contact relationship between the temperature sensor 200 and the lead connector 100 in the third example, and FIG. 7 is a cross-sectioned view of the third example.

Referring to FIGS. 6 and 7, the first terminal 210 provided at one end of the temperature sensor 200 may pass through the lead connector 100 and protrude out of the lead connector 100. The first terminal 210 may protrude out of the lead connector 100 and directly contact the electrode lead 13 at the outside of the lead connector 100. In this case, the first terminal 210 has a plate shape and is inserted into the lead connector 100 and may be bent at the inside or outside of the lead connector 100. In addition, an end of the bent portion of the first terminal 210 may protrude out of the lead connector 100.

Preferably, the first terminal 210 of the temperature sensor 200 according to the example of FIGS. 6 and 7 may pass through the lead connector 100 and the integrated circuit board I and protrude out of the integrated circuit board I. The first terminal 210 protruding out of the integrated circuit board I may be in direct contact with the electrode lead 13.

In general, heat loss may occur during heat passing due to thermal resistance even at a thermally conductive object made of a thermally conductive material. That is, there is a difference in terms of accuracy of temperature measurement between measuring the temperature of a heat source by directly contacting the heat source and measuring the temperature of the heat source through a thermally conductive object.

Thus, since the first terminal 210 of the temperature sensor 200 according to the example of FIGS. 6 and 7 may directly contact the electrode lead 13 serving as a heat source, the temperature sensor 200 may measure the temperature of the electrode lead 13 more accurately.

In the above, an example where the first terminal 210 of the temperature sensor 200 passes through the lead connector 100 and directly contact the electrode lead 13 is described with reference to FIGS. 6 and 7. However, FIGS. 6 and 7 illustrate an example where the first terminal 210 of the temperature sensor 200 passes through the lead connector 100. Thus, the contact relationship between the temperature sensor 200 and the lead connector 100 is not limited by the example of FIGS. 6 and 7. For example, even though FIGS. 6 and 7 show an example where the first terminal 210 is bent inside the lead connector 100 to protrude out of the lead connector 100, in another embodiment, the first terminal 210 may protrude out of the lead connector 100 without being bent.

Figure 8:
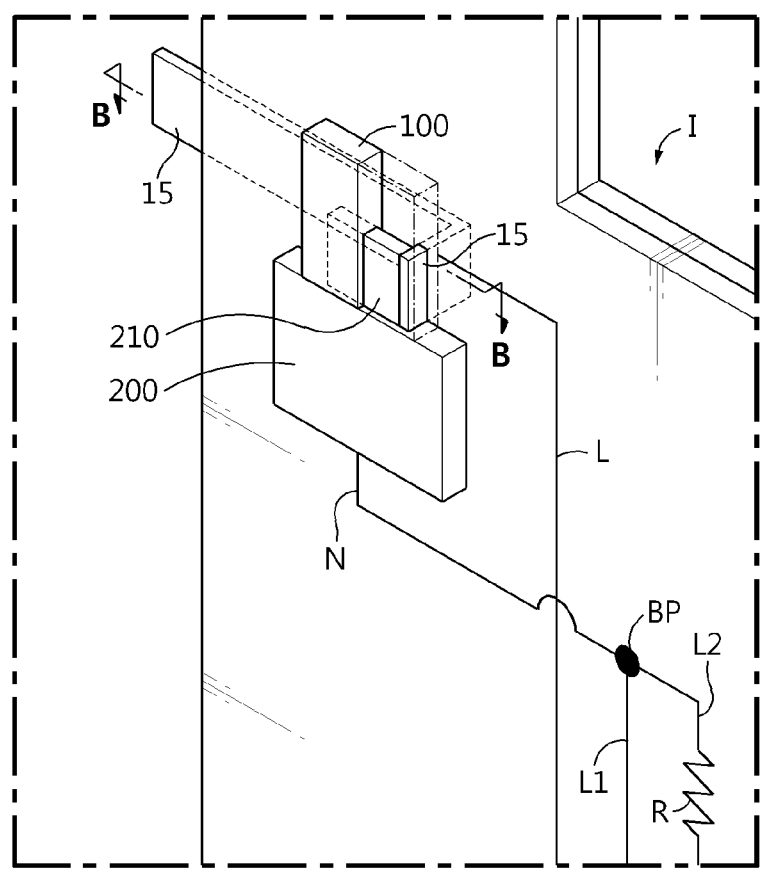
FIG. 8 is a diagram schematically showing a fourth example of the apparatus for measuring temperature of a battery, according to an embodiment of the present disclosure, where the temperature sensor is in contact with the lead connector.
Figure 9:
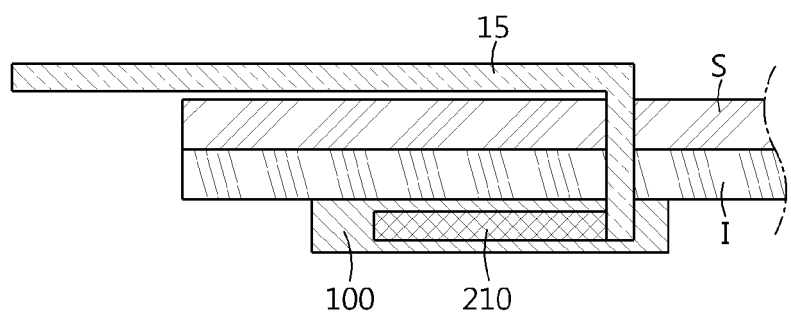
FIG. 9 is a diagram schematically showing the fourth example of FIG. 8, observed at another side.

FIG. 8 is a diagram schematically showing a fourth example of the apparatus for measuring temperature of a battery according to an embodiment of the present disclosure, where the temperature sensor 200 is in contact with the lead connector 100. FIG. 9 is a diagram schematically showing the third example of FIG. 8, observed at another side. Specifically, FIG. 8 is a diagram sectioned to show the contact relationship between the temperature sensor 200 and the lead connector 100 in the fourth example, and FIG. 9 is a longitudinal sectioned view of the fourth example.

Referring to the fourth example shown in FIGS. 8 and 9, both the first terminal 210 of the temperature sensor 200 and the sensing bus bar 15 may be inserted into the lead connector 100. For example, the first terminal 210 of the temperature sensor 200 may be inserted through a first insert groove provided at the lead connector 100, and the sensing bus bar 15 may be inserted through a second insert groove. In this case, the sensing bus bar 15 may be inserted into the second insert groove of the lead connector 100 through the sensing assembly S and the integrated circuit board I.

If the sensing bus bar 15 is inserted into the lead connector 100, the sensing bus bar 15 is surrounded by the inside of the lead connector 100, and thus the contact area between the lead connector 100 and the sensing bus bar 15 may be increased. Thus, if the sensing bus bar 15 is inserted into the lead connector 100, the thermal conduction efficiency between the lead connector 100 and the sensing bus bar 15 is improved, so that the temperature sensor 200 may measure the temperature of the electrode lead 13 more accurately.

Preferably, the first terminal 210 of the temperature sensor 200 and the sensing bus bar 15 inserted into the lead connector 100 may contact each other. In this case, since the first terminal 210 may directly receive the heat of the electrode lead 13 through the sensing bus bar 15, heat loss caused by heat transfer may be minimized Thus, if the first terminal 210 and the sensing bus bar 15 directly contact each other, the temperature sensor 200 may measure the temperature of the electrode lead 13 more accurately, compared to the case where the first terminal 210 and the sensing bus bar 15 are spaced apart from each other.

In the above, an example where the first terminal 210 of the temperature sensor 200 and the sensing bus bar 15 are inserted into the lead connector 100 is described with reference to FIGS. 8 and 9. However, FIGS. 8 and 9 illustrate an example where the first terminal 210 of the temperature sensor 200 and the sensing bus bar 15 are inserted into the lead connector 100. Thus, the contact relationship among the temperature sensor 200, the sensing bus bar 15 and the lead connector 100 is not limited to the example of FIGS. 8 and 9.

In addition, the apparatus for measuring temperature of a battery according to the present disclosure may be provided to a battery pack P. That is, the battery pack P according to the present disclosure may include the apparatus for measuring temperature of a battery according to the present disclosure. Here, the battery pack P may include at least one secondary battery, the apparatus for measuring temperature of a battery, electrical components (such as a BMS, a relay and a fuse), a case and so on.

Figure 10:
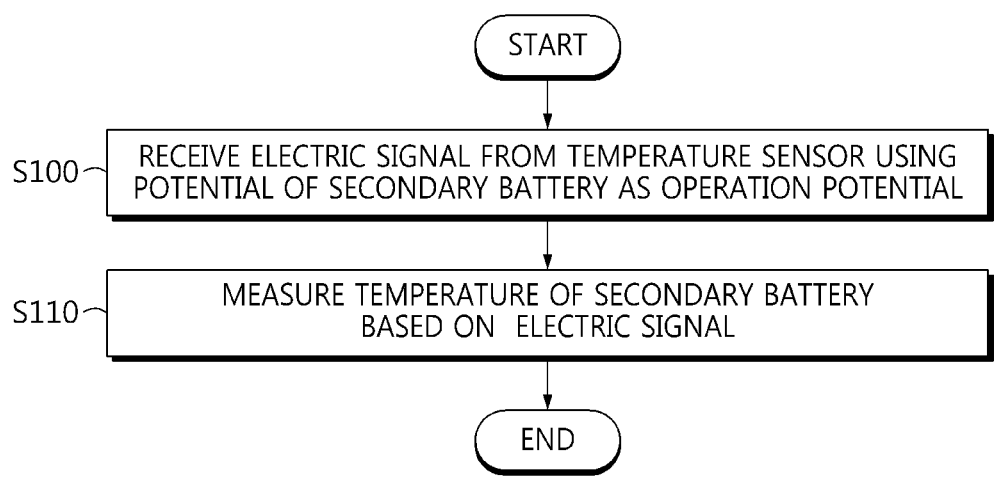
FIG. 10 is a flowchart for illustrating a method for measuring temperature of a battery, according to an embodiment of the present disclosure.

FIG. 10 is a schematic flowchart for illustrating a battery temperature measuring method according to an embodiment of the present disclosure. In FIG. 10, each step may be performed by any component of the apparatus for measuring temperature of a battery according to the present disclosure as described above.

As shown in FIG. 10, a battery temperature measuring method according to the present disclosure includes a signal receiving step S100 and a temperature measuring step S110.

In the signal receiving step S100, the temperature sensor 200 may generate an electric signal based on the temperature of the secondary battery by using the potential of the secondary battery as an operation potential. In addition, the calculating unit 300 may receive the electric signal from the temperature sensor 200. For example, referring to FIG. 1, the calculating unit 300 may receive the generated electric signal from the temperature sensor 200 through the signal line L1 and the BMS connector 400.

Subsequently, in the temperature measuring step S110, the calculating unit 300 may measure the temperature of the secondary battery based on the received electric signal. That is, the calculating unit 300 may calculate the temperature of the secondary battery based on the received electric signal.

Also, when the control logic is implemented in software, the calculating unit 300 may be implemented as a set of program modules. At this time, the program modules may be stored in a memory device and executed by a processor.

In addition, there is no particular limitation on the types of various control logics of the calculating unit 300, as long as one or more control logics are combined and the combined control logic is written in a computer-readable code system so that the computer-readable access is possible. As one example, the recording medium includes at least one selected from the group consisting of a ROM, a RAM, a register, a CD-ROM, a magnetic tape, a hard disk, a floppy disk and an optical data recording device. In addition, the code system may be stored and executed in a distributed manner on computers connected through a network. Moreover, functional programs, code and segments for implementing the combined control logics may be easily inferred by programmers in the technical field to which the present disclosure belongs.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, in this specification, the term 'unit' is used, such as 'calculating unit' and 'memory unit'. However, it will be apparent to those skilled in the art that these terms just represent logical configuration units and are not intended to represent components that are physically separable or must be physically separated.

REFERENCE SIGNS

10: secondary battery
13: electrode lead
15: sensing bus bar
100: lead connector
200: temperature sensor
210: first terminal
300: calculating unit
400: BMS connector
500: memory unit
G: ground terminal
I: integrated circuit board
L: sensing path
L1: signal line
L2: ground line
N: node
P: battery pack
S: sensing assembly

What is claimed is:

1. An apparatus for measuring a temperature of a secondary battery, the apparatus comprising:
   a lead connector mounted on an integrated circuit board and configured such that an electrode lead of the secondary battery is connected to the lead connector;
   a temperature sensor mounted on the integrated circuit board, the temperature sensor including a plurality of terminals, wherein a first terminal of the plurality of terminals is provided at a first end of the temperature sensor in direct contact with the lead connector and is configured to receive an operation power from the secondary battery; and
   a calculating unit electrically connected to the temperature sensor and configured to measure the temperature of the secondary battery based on an electric signal measured by the temperature sensor.

2. The apparatus according to claim 1, further comprising:
   a battery management system (BMS) connector mounted on the integrated circuit board and configured to be electrically connected to a BMS provided outside of the integrated circuit board and electrically connected to a second terminal provided at a second end of the temperature sensor.

3. The apparatus according to claim 2,
   wherein the integrated circuit board further includes a signal line configured to electrically connect the second terminal and the BMS connector to each other directly.

4. The apparatus according to claim 3, wherein the apparatus comprises a plurality of temperature sensors mounted on the integrated circuit board, and
   wherein a respective signal line is provided to the integrated circuit board for each of the plurality of temperature sensors.

5. The apparatus according to claim 3,
   wherein the integrated circuit board includes a ground terminal, and
   wherein the integrated circuit board further includes a ground line configured to electrically connect the second terminal and the ground terminal to each other.

6. The apparatus according to claim 5,
   wherein the ground line is a circuit pattern line branched on the signal line directly connected to the second terminal.

7. The apparatus according to claim 5,
   wherein an operation potential of the temperature sensor indicates a potential applied between the lead connector and the ground terminal.

8. The apparatus according to claim 1, further comprising:
   a sensing assembly mounted on the integrated circuit board and including a sensing bus bar connected to the electrode lead of the secondary battery to electrically connect the lead connector and the electrode lead of the secondary battery through the sensing bus bar.

9. The apparatus according to claim 8,
   wherein both the first terminal of the temperature sensor and the sensing bus bar are configured to be inserted into the lead connector.

10. The apparatus according to claim 1,
wherein the first terminal of the temperature sensor is configured to receive the operation power from the secondary battery when inserted into the lead connector to directly contact the lead connector.

11. The apparatus according to claim 10,
wherein the first terminal is configured to protrude out of the lead connector through an inside of the lead connector when in direct contact with the electrode lead.

12. A battery pack, comprising the apparatus of claim 1.

13. The apparatus according to claim 1, wherein the temperature sensor is configured to sense a temperature of the secondary battery through thermal conduction by contact to the lead connector.

14. The apparatus according to claim 1, wherein the lead connector includes an insert groove, and wherein the first terminal of the temperature sensor is inserted into the insert groove of the lead connector.

15. An integrated circuit board comprising:
a lead connector mounted on the integrated circuit board and configured such that an electrode lead of the secondary battery is connected to the lead connector;
a temperature sensor mounted on the integrated circuit board, the temperature sensor including a plurality of terminals, wherein a first terminal of the plurality of terminals is provided at a first end of the temperature sensor and configured to use a potential of the secondary battery as an operation potential when a first terminal of the plurality of terminals and provided at a first end of the temperature sensor is in direct contact with the lead connector; and
a ground terminal representing a reference potential on the integrated circuit board and configured to be electrically connected to a second end of the temperature sensor.

16. A method for measuring a temperature of a secondary battery at an integrated circuit board configured to contact an electrode lead of the secondary battery, the method comprising:
supplying a potential of the secondary battery as an operation potential to receive an electric signal from a temperature sensor mounted on the integrated circuit board and in direct contact with a lead connector of the electrode lead, wherein the lead connector is also mounted on the integrated circuit board; and
measuring a temperature of the secondary battery based on the electric signal received from the temperature sensor.

* * * * *